(12) United States Patent
Li

(10) Patent No.: US 7,796,069 B2
(45) Date of Patent: Sep. 14, 2010

(54) ANALOG TO DIGITAL CONVERTERS

(75) Inventor: Guo Xing Li, Sunnyvale, CA (US)

(73) Assignee: 02Micro International Limited, Grand Cayman (KY)

( * ) Notice: Subject to any disclaimer, the term of this patent is extended or adjusted under 35 U.S.C. 154(b) by 0 days.

(21) Appl. No.: 12/317,939

(22) Filed: Dec. 31, 2008

(65) Prior Publication Data

US 2009/0195423 A1 Aug. 6, 2009

Related U.S. Application Data

(60) Provisional application No. 61/063,744, filed on Feb. 6, 2008.

(51) Int. Cl.
*H03M 1/00* (2006.01)

(52) U.S. Cl. ........................ 341/122; 341/155
(58) Field of Classification Search ................. 341/122, 341/143, 155, 141
See application file for complete search history.

(56) References Cited

U.S. PATENT DOCUMENTS

| | | | |
|---|---|---|---|
| 4,968,988 A * | 11/1990 | Miki et al. ................. | 341/141 |
| 5,208,597 A | 5/1993 | Early et al. | |
| 5,248,971 A * | 9/1993 | Mandl ........................ | 341/141 |
| 5,351,050 A | 9/1994 | Thompson et al. | |
| 6,518,903 B1 * | 2/2003 | Perraud et al. .............. | 341/143 |
| 7,142,606 B2 * | 11/2006 | Talwalkar et al. ........... | 375/259 |

FOREIGN PATENT DOCUMENTS

EP     0551690 A1     7/1993

OTHER PUBLICATIONS

Extended European Search Report received in European Application No. 09151502.3 dated Jun. 8, 2009. (6 pages).

* cited by examiner

*Primary Examiner*—Brian Young

(57) ABSTRACT

An analog to digital converter (ADC) converts an analog signal to a digital signal. The ADC includes an input channel, a sampling circuit coupled to the input channel, an integrator coupled to the sampling circuit, and a feedback circuit coupled to the integrator. The input channel receives the analog signal. The sampling circuit samples the analog signal. The integrator receives the sampled analog signal and a feedback signal and integrates a superposition of the sampled analog signal and the feedback signal. The feedback circuit generates the digital signal according to an output of the integrator and sends the feedback signal indicative of the digital signal to the integrator.

19 Claims, 4 Drawing Sheets

US 7,796,069 B2

ANALOG TO DIGITAL CONVERTERS

RELATED APPLICATION

This application claims priority to U.S. provisional application, titled "Multi-channel Analog to Digital Converters", Ser. No. 61/063,744, filed on Feb. 6, 2008, which is incorporated herein by reference in its entirety.

BACKGROUND

In data acquisition application fields, sometimes multiple analog signals are captured and converted to digital signals over a given time frame simultaneously or parallelly.

In one of the conventional architectures, a sample/hold block is employed for each input channel. All analog signals from the input channels are sampled simultaneously and then enter hold states. During the hold time period, an analog to digital converter (ADC) can be used to convert the sampled analog values to digital signals sequentially until the sampled signals from all the input channels are converted to digital signals. Some drawbacks exist in this architecture. For instance, multiple sample/hold blocks may be required for multiple channels and the sample/hold blocks can be sensitive to high frequency noises without low-pass filtering capabilities.

In another conventional architecture, each input channel employs an individual ADC. Therefore, multiple ADCs are required in a data acquisition system with multiple input channels. Averaging-type ADCs can be used in this architecture to implement synchronization among multiple input channels. However, power consumption, die area and cost of the data acquisition system can be increased if multiple ADCs are employed. In addition, different ADCs may cause mismatch among multiple input channels.

SUMMARY

An analog to digital converter (ADC) converts an analog signal to a digital signal. The ADC includes an input channel, a sampling circuit coupled to the input channel, an integrator coupled to the sampling circuit, and a feedback circuit coupled to the integrator. The input channel receives the analog signal. The sampling circuit samples the analog signal. The integrator receives the sampled analog signal and a feedback signal and integrates a superposition of the sampled analog signal and the feedback signal. The feedback circuit generates the digital signal according to an output of the integrator and sends the feedback signal indicative of the digital signal to the integrator.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION

Reference will now be made in detail to the embodiments of the present invention, examples of which are illustrated in the accompanying drawings. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the embodiments of the present invention.

Embodiments described herein may be discussed in the general context of computer-executable instructions residing on some form of computer-usable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

By way of example, and not limitation, computer-usable media may comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information.

A multi-channel analog to digital converter (ADC) can convert multiple analog signals from multiple input channels to multiple digital output signals, e.g., multiple analog voltages to multiple digital output voltages, in an interleaved mode. The multi-channel ADC can be used in various data processing applications, such as video systems, audio systems, signal sensors, etc., which may require analog to digital conversions.

Figure 1:
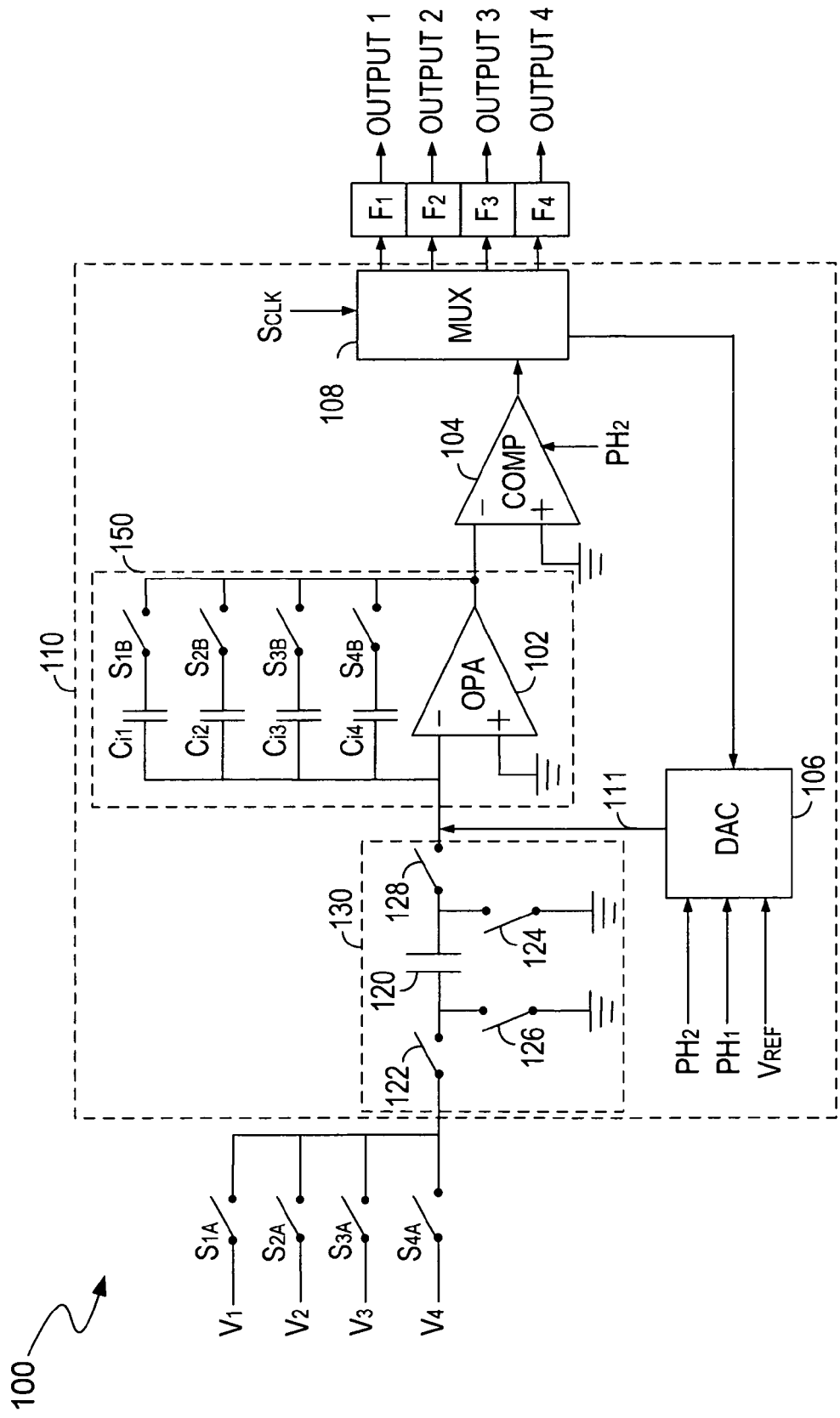
FIG. 1 illustrates a block diagram of a multi-channel analog to digital converter (ADC), in accordance with one embodiment of the present invention.

FIG. 1 illustrates a block diagram of an ADC, e.g., a multi-channel ADC 100, in accordance with one embodiment of the present invention. The multi-channel ADC 100 can be a first-order delta-sigma ADC, in one embodiment.

The multi-channel ADC 100 can have multiple input channels, e.g., four input channels including channel 1, channel 2, channel 3, and channel 4 for converting analog signals, e.g., analog voltage signals $V_1$, $V_2$, $V_3$ and $V_4$ respectively to digital signals in an interleaved mode, in one embodiment. Each input channel is coupled to an associated switch, e.g., $S_{1A}$ associated with channel 1, $S_{2A}$ associated with channel 2, $S_{3A}$ associated with channel 3, and $S_{4A}$ associated with channel 4.

The switches $S_{1A}$, $S_{2A}$, $S_{3A}$, and $S_{4A}$ can be controlled by a system clock signal $S_{CLK}$, in one embodiment. In one embodiment, one input channel is selected during a clock cycle according to the system clock signal $S_{CLK}$. The switch associated with the selected input channel is turned on and other switches are turned off in one clock cycle, in one embodiment.

The multi-channel ADC 100 includes a modulator 110 for converting analog signals (e.g., the analog voltage signals $V_1$, $V_2$, $V_3$ or $V_4$) to digital signals. The modulator 110 can be a first-order delta-sigma modulator, or a second-order modulator, etc., according to different application requirements.

The modulator 110 can receive an analog signal from a selected input channel and provide a corresponding digital signal to a filter (e.g., a digital filter $F_1$, $F_2$, $F_3$, or $F_4$) associated with the input channel. The analog signal can be various types of signals, e.g., current or voltage signals.

The modulator 110 can sample the received analog signal at a predetermined sampling frequency, e.g., a frequency equal to FS*OSR, where Fs is a Nyquist frequency and OSR is an over sampling ratio to the Nyquist frequency. For example, the sampling frequency is 65536 Hz when Fs is 16 Hz and OSR is 4096. The analog signal can be translated to a digital signal at the sampling frequency by the modulator 110. In one embodiment, the digital signal can be a continuous 1-bit data stream including logic 1 and logic 0 at a rate determined by the sampling frequency (e.g., Fs*OSR).

In one embodiment, the modulator 110 includes a sampling circuit 130 for sampling the analog signal. The sampling circuit 130 can include an energy storage unit (e.g., sampling capacitor) 120 coupled to the selected input channel for storing charges from the selected input channel, and can include a switch array including switches 122, 124, 126, and 128 for controlling the energy storage unit 120. Switches 122 and 124 are controlled by a signal $PH_2$, and switches 126 and 128 are controlled by a signal $PH_1$. The signals $PH_1$ and $PH_2$ are non-overlapping clock signals, in one embodiment. For example, when the signal $PH_2$ is at a high level and the signal $PH_1$ is at a low level, switches 122 and 124 can be turned on and switches 126 and 128 can be turned off. When the signal $PH_1$ is at a high level and the signal $PH_2$ is at a low level, switches 122 and 124 can be turned off and switches 126 and 128 can be turned on.

The modulator 110 can further include an integrator 150 coupled to the sampling circuit 130 for receiving the sampled analog signal and a feedback signal 111 and for integrating a superposition of the sampled analog signal and the feedback signal 111 and generating an output. In the example of FIG. 1, the integrator 150 includes a group of integrating capacitors (e.g., integrating capacitors $C_{i1}$, $C_{i2}$, $C_{i3}$, and $C_{i4}$) and an error amplifier 102.

The integrating capacitors $C_{i1}$, $C_{i2}$, $C_{i3}$, and $C_{i4}$ are coupled in parallel. The integrating capacitors $C_{i1}$, $C_{i2}$, $C_{i3}$, and $C_{i4}$ can accumulate charges from channel 1, channel 2, channel 3, and channel 4 respectively. Each integrating capacitor $C_{i1}$, $C_{i2}$, $C_{i3}$, or $C_{i4}$ can be coupled to a switch in series, e.g., the integrating capacitor $C_{i1}$ is coupled to a switch $S_{iB}$, the integrating capacitor $C_{i2}$ is coupled to a switch $S_{2B}$, the integrating capacitor $C_{i3}$ is coupled to a switch $S_{3B}$, and the integrating capacitor $C_{i4}$ is coupled to a switch $S_{4B}$.

In one embodiment, the modulator 110 can complete an analog to digital conversion for each input channel sequentially during a conversion cycle. In one embodiment, the integrating capacitors can be randomly allocated to the input channels at the beginning of a conversion cycle. For example, the integrating capacitor $C_{i1}$ can store charges from channel 2, the integrating capacitor $C_{i2}$ can store charges from channel 3, the integrating capacitor $C_{i3}$ can store charges from channel 4, and the integrating capacitor $C_{i4}$ can store charges from channel 1, etc. The flexible configuration of the input channels and the integrating capacitors can reduce mismatch between different channels caused by mismatch of the integrating capacitors. In one embodiment, the output of the integrator 150 can include the previous charges stored in a corresponding integrating capacitor during a previous conversion cycle and an integration result of the superposition of the sampled analog signal and the feedback signal 111.

In one embodiment, the error amplifier 102 has two input terminals (e.g., an inverting input terminal and a non-inverting input terminal) and an output terminal. The error amplifier 102 can receive an input signal through the inverting input terminal and a first reference signal through the non-inverting input terminal. In one embodiment, the input signal can be a superposition of the sampled analog signal of an input channel and the feedback signal 111. In one embodiment, the non-inverting input terminal is connected to ground such that a voltage level of the first reference signal is substantially equal to zero. The error amplifier 102 can generate an error signal according to a difference between the input signal (e.g., the superposition of the sampled analog signal and the feedback signal 111) and the first reference signal. In one embodiment, the error signal is a voltage signal.

The modulator 110 further includes a feedback circuit for generating a digital signal according to an output of the integrator 150 and for sending the feedback signal 111 indicative of the digital signal to the integrator 150. In the example of FIG. 1, the feedback circuit can include a comparator 104, a multiplexer 108, and a digital to analog converter (DAC) 106. In other words, the integrator 150, the comparator 104, the multiplexer 108, and the DAC 106 together form a feedback loop. The feedback loop includes a feed forward path including the integrator 150, the comparator 104 and the multiplexer 108, and a feed backward path including the DAC 106.

The comparator 104 coupled to the integrator 150 can compare the output of the integrator 150 with a second reference signal and for generating a comparator output signal according to the comparison result. In one embodiment, the output of the integrator 150 can include the previous charges stored in a corresponding integrating capacitor during a previous conversion cycle and an integration result of the superposition of the sampled analog signal and the feedback signal 111.

The comparator 104 can be controlled by the signal $PH_2$ and can operate when the signal $PH_2$ is at a high level. In one embodiment, a non-inverting terminal of the comparator 104 is connected to ground. Thus, a voltage level of the second reference signal is substantially zero. The comparator 104 can generate a 1-bit digital signal (e.g., logic 1 or logic 0) according to the comparison result. The comparator output signal, e.g., a 1-bit digital signal, is further sent to the multiplexer 108.

In one embodiment, the multiplexer 108 can be a barrel shift register controlled by a system clock signal $S_{CLK}$. The multiplexer 108 can pass the digital signal from the comparator 104, e.g., a 1-bit digital signal, to an output channel, e.g., a digital filter associated with the selected input channel according to the system clock signal $S_{CLK}$. The output channels can include digital filters $F_1$, $F_2$, $F_3$, and $F_4$, such as decimation filters to decimate the digital signals (e.g., the 1-bit digital signals from the comparator 104) to multi-bit digital output signals. Therefore, multiple digital output signals associated with the multiple input channels can be obtained from the digital filters (e.g., $F_1$, $F_2$, $F_3$, and $F_4$), respectively.

Additionally, the multiplexer 108 can latch the 1-bit digital signal from the comparator 104 associated with each input channel. Consequently, during a current conversion cycle, the 1-bit digital signal of each input channel generated in a previous conversion cycle is latched in the multiplexer 108 until a new 1-bit digital signal is generated. When one input channel is selected according to the system clock signal $S_{CLK}$ in the current conversion cycle, the multiplexer 108 can transfer the 1-bit digital signal of the selected input channel which is generated in a previous conversion cycle to the DAC 106. During the first conversion cycle, the multiplexer 108 can transfer a 1-bit digital, e.g., logic 0 to the DAC 106, in one embodiment.

The DAC 106 can be a 1-bit digital to analog converter, in one embodiment. The DAC 106 can receive the 1-bit digital signal from the multiplexer 108 and convert the 1-bit digital signal to an analog signal (e.g., a voltage signal) according to a reference voltage $V_{REF}$. The analog signal generated by the DAC 106 can be used as the feedback signal 111 sent to the integrator 150. The DAC 106 can set the feedback signal 111 equal to $-V_{REF}$ when the 1-bit digital signal is logic 1 and equal to $V_{REF}$ when the 1-bit digital signal is logic 0, in one embodiment. The DAC 106 can be controlled by signals $PH_1$ and $PH_2$. Thus, the value of the feedback signal 111 can be set according to the 1-bit digital signal from the multiplexer 108.

More specifically, when channel 1 is selected according to the system clock signal $S_{CLK}$ in a clock cycle during a current conversion cycle, the modulator 110 can receive the analog signal from channel 1 (e.g., the analog voltage signal $V_1$) and a feedback signal 111 from the DAC 106, and generate a 1-bit digital signal. In one embodiment, the feedback signal 111 from the DAC 106 is generated according to a 1-bit digital signal of channel 1 generated in a previous conversion cycle and according to a reference voltage $V_{REF}$. The comparator 104 can generate a 1-bit digital signal to the multiplexer 108. As such, the previous 1-bit digital signal in the multiplexer 108 associated with channel 1 can be replaced by the new 1-bit digital signal generated in the current conversion cycle. The multiplexer 108 can output the 1-bit digital signal generated in the current conversion cycle to the corresponding digital filter $F_1$. A next input channel, e.g., channel 2, can be selected during a next clock cycle of the system clock signal $S_{CLK}$ and a corresponding 1-bit digital signal can be received by an associated filter. For example, channel 1, channel 2, channel 3, and channel 4 are selected sequentially and 1-bit digital signals corresponding to channel 1, channel 2, channel 3, and channel 4 can be received by the digital filter $F_1$, the digital filter $F_2$, the digital filter $F_3$, and the digital filter $F_4$ sequentially. The digital filters (e.g., $F_1$, $F_2$, $F_3$, and $F_4$) can accumulate the 1-bit digital signals for several conversion cycles for corresponding input channels and then can generate multi-bit digital output signals.

Although FIG. 1 shows a multi-channel analog to digital converter 100, the invention is not so limited. For example, the modulator 110 can also be used in a single channel analog to digital converter.

Figure 2:
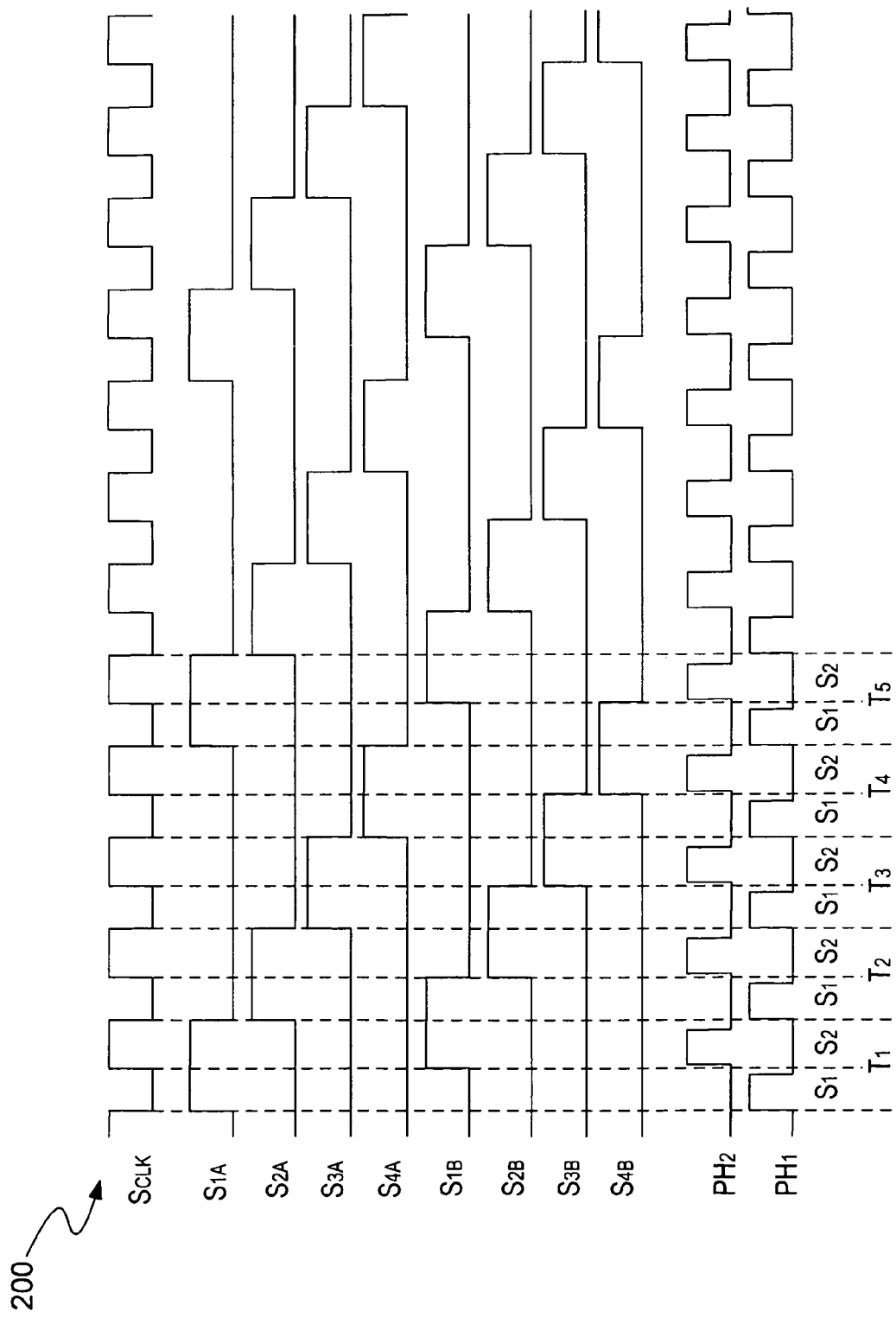
FIG. 2 illustrates a timing diagram of signals generated by a multi-channel ADC, in accordance with one embodiment of the invention.

Operations of the multi-channel ADC 100 will be described herein with reference to a timing diagram in FIG. 2 as an example. FIG. 2 illustrates waveforms of the system clock signal $S_{CLK}$, states of the switches $S_{1A}$, $S_{2A}$, $S_{3A}$, $S_{4A}$, $S_{1B}$, $S_{2B}$, $S_{3B}$, and $S_{4B}$, and the signal $PH_2$ and the signal $PH_1$ during operations of the multi-channel ADC 100, in one embodiment. FIG. 2 is only for illustrative purposes, and the present invention is not limited to the operation shown in FIG. 2. In the example of FIG. 2, a switch is turned on when a corresponding state waveform is at a high level and the switch is turned off when the corresponding state waveform is at a low level.

In the example of FIG. 2, a clock cycle of the system clock signal $S_{CLK}$ is divided into two phases including phase $S_1$ when the system clock signal $S_{CLK}$ is at a low level and phase $S_2$ when the system clock signal $S_{CLK}$ is at a high level. For instance, each clock cycle, e.g., $T_1$, $T_2$, $T_3$, $T_4$, $T_5$, etc., includes phase $S_1$ and phase $S_2$. The signal $PH_1$ is set to a high level and the signal $PH_2$ is set to a low level during phase $S_1$ of each clock cycle. Similarly, the signal $PH_1$ is set to a low level and the signal $PH_2$ is set to a high level during phase $S_2$ of each clock cycle. Because the signal $PH_1$ and the signal $PH_2$ are non-overlapping clock signals, widths of pulses of the signal $PH_1$ and the signal $PH_2$ can be smaller than the widths of the pulses of the system clock signal $S_{LCK}$ to avoid overlapping, in one embodiment.

In one embodiment, channel 1 is first selected after the multi-channel ADC 100 is powered on during the clock cycle $T_1$. The switches $S_{1A}$ and $S_{1B}$ associated with channel 1 are turned on and switches associated with other input channels (e.g., channel 2, channel 3, and channel 4) are turned off. In one embodiment, the switch $S_{1B}$ is turned on after a delay of half of a clock cycle, e.g., the switch $S_{1A}$ is turned on during the clock cycle $T_1$ and the switch $S_{1B}$ is turned on during phase $S_2$ of the clock cycle $T_1$ and phase $S_1$ of the clock cycle $T_2$. The switches 122 and 124 are turned on during phase $S_2$ of the clock cycle $T_1$ according to a high level of the signal $PH_2$. Simultaneously, the switches 126 and 128 are turned off according to a low level of the signal $PH_1$ during phase $S_2$ of the clock cycle $T_1$. Therefore, the analog signal from channel 1 (e.g., the analog voltage signal $V_1$) can be transferred to the sampling capacitor 120 via the closed switches $S_{1A}$, 124 and 122, and can be sampled. Charges from channel 1 corresponding to the analog voltage signal $V_1$ can be stored in the sampling capacitor 120.

During phase $S_1$ of the clock cycle $T_2$, the switches 122 and 124 are turned off according to a low level of the signal $PH_2$, and the switches 126 and 128 are turned on according to a high level of the signal $PH_1$. Consequently, the charges stored in the sampling capacitor 120 can be transferred to the integrating capacitor $C_{i1}$ via the closed switches 126, 128 and $S_{1B}$.

Additionally, the DAC 106 generates a feedback signal 111 to the integrator 150 according to a 1-bit digital signal of channel 1 in a previous conversion cycle. The output of the integrator 150 can be compared with the second reference signal by the comparator 104 when the signal $PH_2$ is at a high level during phase $S_2$ of the clock cycle $T_2$. A 1-bit digital signal of channel 1 can be generated by the comparator 104 and be latched in the multiplexer 108. The digital filter $F_1$ can receive the 1-bit digital signal.

Channel 2 is selected during the clock cycle $T_2$. The operating sequence associated with channel 2 is similar to the operating sequence associated with channel 1. Switches $S_{2A}$, 122, and 124 are turned on and the switches 126 and 128 are turned off according to a high level of the signal $PH_2$ during phase $S_2$ of the clock cycle $T_2$. An analog signal of channel 2 (e.g., an analog voltage signal $V_2$) can be transferred to the sampling capacitor 120 and be sampled. During phase $S_1$ of the clock cycle $T_3$, the switches 122 and 124 are turned off and the switches 126 and 128 are turned on according to a high level of the signal $PH_1$. Because the switch $S_{1B}$ is turned off after phase $S_1$ of the clock cycle $T_2$ and the switch $S_{2B}$ is turned on during phase $S_2$ of the clock cycle $T_2$ and phase $S_1$ of the clock cycle $T_3$, charges stored in the sampling capacitor 120 can be transferred to the integrating capacitor $C_{i2}$ during phase $S_1$ of the clock cycle $T_3$. Then, the comparator 104 can operate during phase $S_2$ of the clock cycle $T_3$ and generate a 1-bit digital signal of channel 2 to the multiplexer 108. The digital filter $F_2$ can receive the 1-bit digital signal.

Similarly, channel 3 can be selected during the clock cycle $T_3$ and can generate a 1-bit digital signal during phase $S_2$ of the clock cycle $T_4$. Channel 4 can be selected during the clock cycle $T_4$ and can generate a 1-bit digital signal during phase $S_2$ of the clock cycle $T_5$. If more input channels are available, the input channels can be selected sequentially during sequential clock cycles. Thus, the analog signals from the input channels can be converted to digital signals sequentially and circularly. For example, if four input channels exist, at least four clock cycles (e.g., $T_1, T_2, T_3$, and $T_4$) can be used to accomplish one conversion cycle for all the input channels. The digital filters (e.g., $F_1, F_2, F_3$, or $F_4$) can receive the 1-bit digital signals for the associated input channels (e.g., channel 1, channel 2, channel 3, or channel 4) during each conversion cycle. Then a next conversion cycle starts from the clock cycle $T_5$. Similarly, each input channel is selected sequentially and each analog signal is sampled sequentially. Consequently, each digital filter can accumulate the 1-bit digital signals of the associated input channel during multiple conversion cycles and decimate the 1-bit digital signals to generate a multi-bit digital output signal at a predetermined rate, e.g., Fs.

Assume that the over sampling ratio is OSR, then the time required for a conversion cycle is N*OSR clocks, where N represents the total number of channels, in one embodiment. Advantageously, in one conversion cycle, the analog signals from the input channels can be sampled and converted to 1-bit digital signals respectively and sequentially, in one embodiment. Thus, multi-bit digital output signals of the multiple input channels can be obtained during multiple conversion cycles in a synchronized way. As a result, the multi-channel ADC 100 has an improved efficiency and reduced power consumption, in one embodiment.

Additionally, in order to speed up the conversions, double sampling technique can be used by adding another switch array (e.g., similar to the switches 122, 124, 126 and 128) and a sampling capacitor (e.g., similar to the sampling capacitor 120) with complementary control clock signals (e.g., $PH_1$ and $PH_2$). In this topology, the speed of the ADC conversion can be doubled without increasing static power consumption. Other sampling techniques, e.g., triple sampling technique can also be used to further speed up the conversions of the ADC 100.

Figure 3:
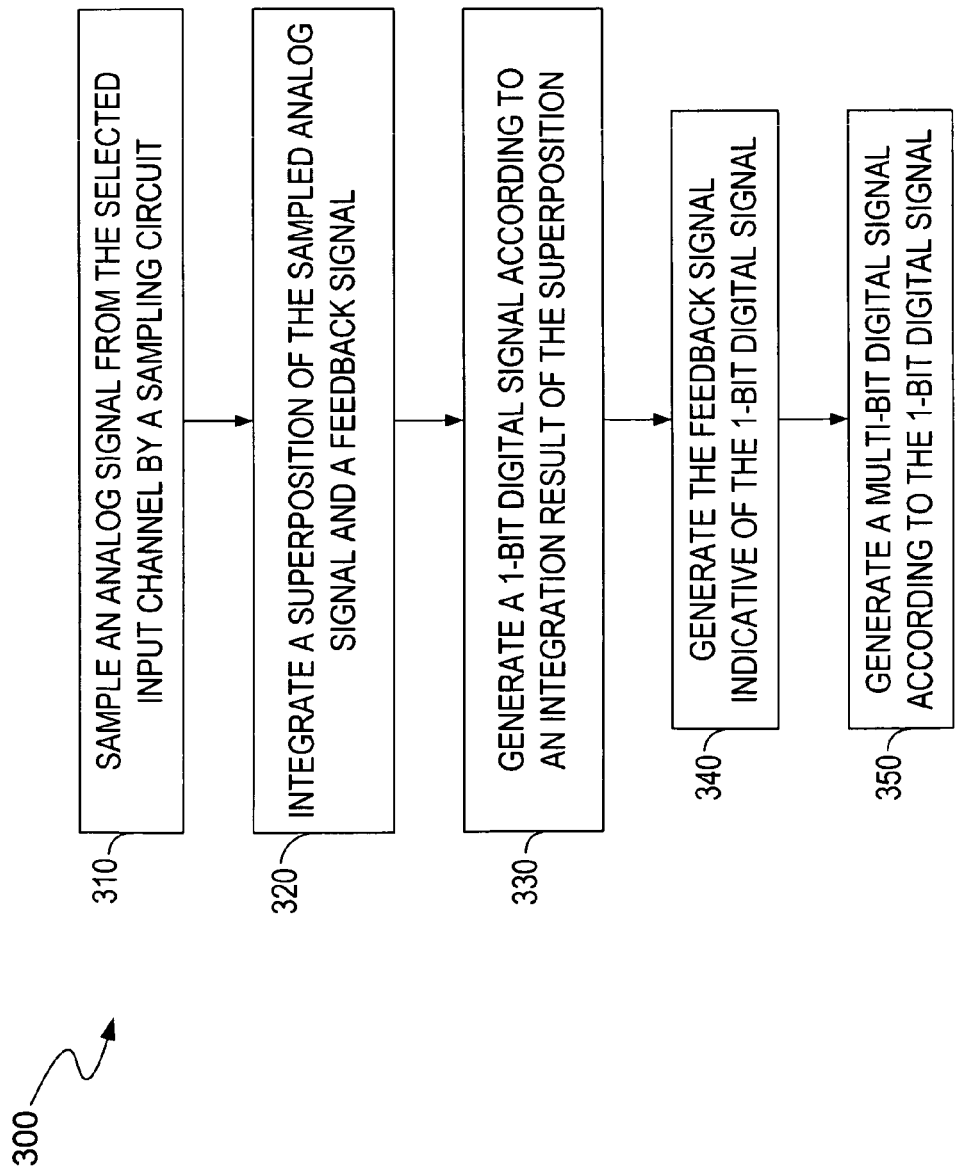
FIG. 3 illustrates a flowchart of operations performed by a multi-channel ADC, in accordance with one embodiment of the present invention.

FIG. 3 illustrates a flowchart 300 of operations performed by an ADC, e.g., the multi-channel ADC, in accordance with one embodiment of the present invention. Descriptions of FIG. 3 will be made in combination with FIG. 1. One input channel (e.g., channel 1, channel 2, channel 3, or channel 4) is selected to receive an analog signal by the multi-channel ADC 100 during a clock cycle of the system clock signal $S_{CLK}$. In block 310, the analog signal from the selected input channel is sampled by a sampling circuit 130 during the same clock cycle under the control of a switch array. In block 320, charges from the sampling capacitor 120 can be transferred to one of the integrating capacitors (e.g., $C_{i1}$, $C_{i2}$, $C_{i3}$ or $C_{i4}$) under the control of an associate switch (e.g., $S_{1B}$, $S_{2B}$, $S_{3B}$, or $S_{4B}$). The integrator 150 can integrate a superposition of the sampled analog signal and a feedback signal. The integrating capacitors can be randomly allocated to the input channels at the beginning of a conversion cycle. Advantageously, the flexible configuration of the input channels and the integrating capacitors can reduce mismatch among different channels caused by mismatch of the integrating capacitors.

In block 330, a comparator (e.g., the comparator 104) can generate a 1-bit digital signal according to an integration result of the superposition. More specifically, the comparator 104 can compare an integrator output with a reference signal (e.g., the voltage level zero) to generate the 1-bit digital signal, and can send the 1-bit digital signal to the multiplexer 108. The integrator output is generated according to previous charges stored in the corresponding integrating capacitor and according to an integration result of the sampled analog signal and the feedback signal. In block 340, the multiplexer 108 can output the 1-bit digital signal to the DAC 106 and a corresponding digital filter (e.g., $F_1, F_2, F_3$, or $F_4$). Hence, the feedback signal 111 can be provided to indicate the 1-bit digital signal. In block 350, the corresponding digital filter can generate a multi-bit digital output signal according to the 1-bit digital signal. More specifically, the corresponding digital filter can accumulate the 1-bit digital signals for several conversion cycles for a corresponding input channel and then can generate the multi-bit digital output signal.

Advantageously, multiple input channels can be selected sequentially and corresponding analog signals thereof can be sampled in block 310. Similarly, the analog signals from other input channels can be converted to digital output signals sequentially via block 310 to block 340. Advantageously, the traditional sample/hold blocks in the multiple input channels due to synchronization sampling can be avoided such that the whole cost of the circuitry can be reduced.

Figure 4:
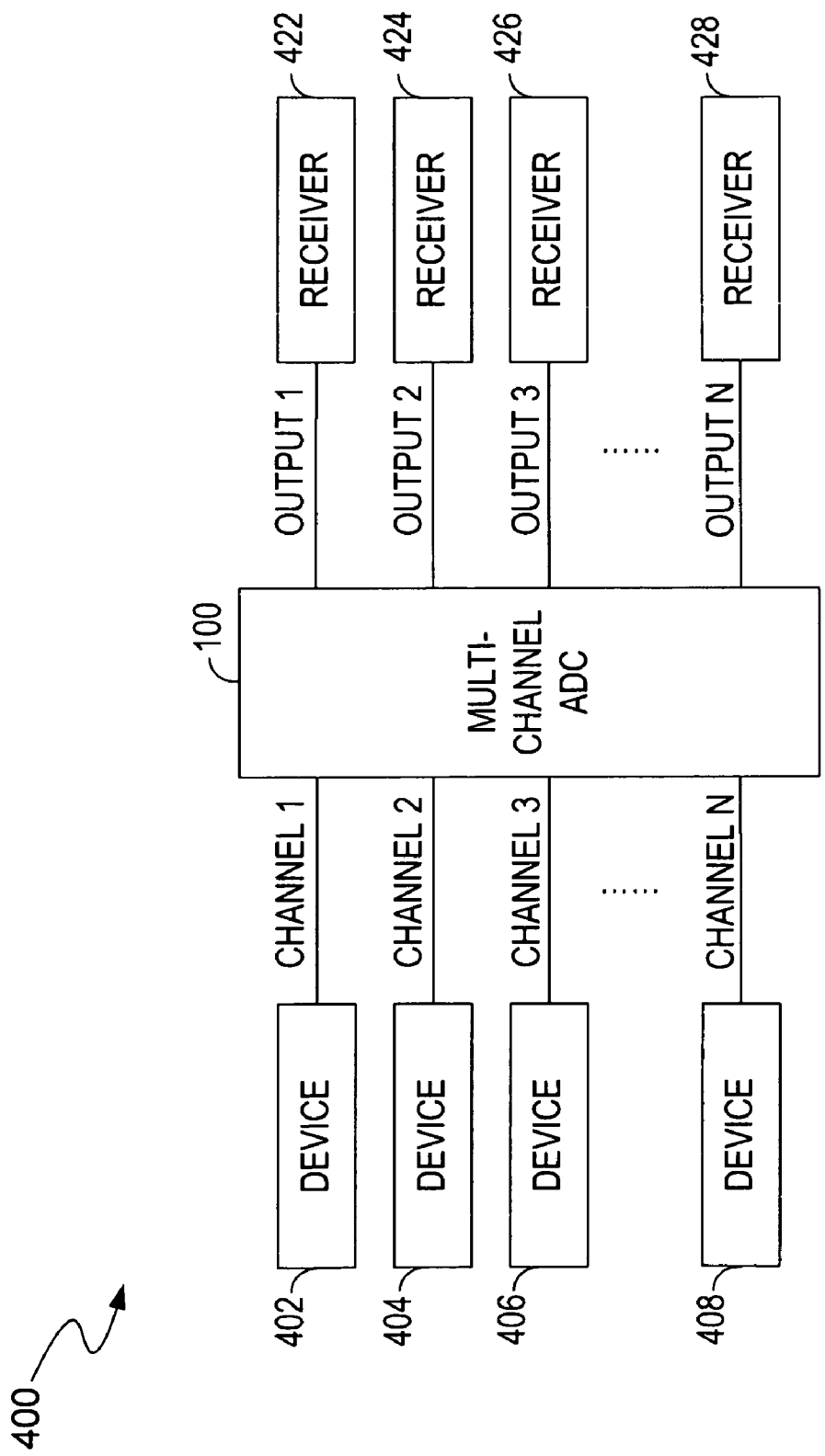
FIG. 4 illustrates a block diagram of an electronic system, in accordance with one embodiment of the present invention.

FIG. 4 illustrates a block diagram of an electronic system 400, in accordance with one embodiment of the present invention. The electronic system 400 employs the multi-channel ADC 100 disclosed hereinabove, in one embodiment. The multi-channel ADC 100 has multiple input channels (e.g., channel 1, channel 2, channel 3, . . . , channel N) for receiving analog signals from multiple devices (e.g., devices 402, 404, 406, . . . , 408), and for converting the analog signals to digital output signals (e.g., output 1, output 2, output 3, . . . , output N) respectively. The digital output signals can be received by various receivers (e.g., receivers 422, 424, 426, . . . , 428). The multi-channel ADC 100 includes a modulator, e.g., the modulator 110, for converting the analog signals to 1-bit digital signals, and multiple digital filters, e.g., $F_1, F_2, F_3$, and $F_4$, for generating multi-bit digital output signals according to the 1-bit digital signals. The multiple devices (e.g., the devices 402, 404, 406, . . . , 408) can be various types of devices, e.g., audio systems, video systems, etc., which can generate analog signals. The receivers (e.g., the receivers 422, 424, 426, . . . , 428) can be various types of devices which can receive digital signals. For example, the multi-channel ADC 100 can be used for converting analog voltage monitoring signals indicating battery/cell voltages to digital signals. A battery management system can receive the digital signals and control the battery.

Accordingly, an ADC (e.g., the multi-channel ADC) 100 for converting an analog signal to a digital signal can include multiple input channels (e.g., channel 1, channel 2, channel 3, channel 4, etc.), a sampling circuit 130 coupled to the multiple input channels, an integrator 150 coupled to the sampling circuit 130, and a feedback circuit coupled to the integrator 150, in one embodiment. The multiple input channels can receive an analog signal when the associated switch is turned on. The sampling circuit 130 includes an energy storage unit 120 for sampling the analog signal from the selected input channel and includes a switch array for controlling the energy storage unit 120. The integrator 150 can include multiple capacitors (e.g., integrating capacitors) coupled in parallel and an error amplifier 102 coupled to the sampling circuit 130. The integrating capacitors are coupled to multiple switches respectively. One of the integrating capacitors can store charges from the sampling capacitor 120 when the associate switch is turned on.

The feedback circuit can include a comparator 104 coupled to the integrator 150, a multiplexer 108 coupled to the comparator 104, and a DAC 106 coupled to the sampling circuit 130. The comparator 104 can compare an output of the integrator 150 with a reference signal (e.g., zero volts) and generate a comparator output signal according to the comparison result. The multiplexer 108 can provide the digital signal according to the comparator output signal. The DAC 106 can generate a feedback signal 111 according to the digital signal. The multi-channel ADC 110 can further include output channels to provide multi-bit digital output signals.

Advantageously, the multi-channel ADC 100 can perform analog to digital conversions for the multiple input channels in a synchronized and interleaved mode. Multiple sample/hold blocks or multiple ADCs are not required for converting analog signals from multiple input channels, in one embodiment. Hence, the cost of the circuitry can be reduced and the efficiency of the circuitry can be improved. Additionally, the mismatch between multiple ADCs can be reduced/avoided.

The aforementioned embodiments can also be used in a single channel ADC, when one integrating capacitor and an associated switch coupled in series are included in the integrator 150 and one input channel and one digital filter are included in FIG. 1.

The embodiments that have been described herein, however, are some of the several that utilize this invention and are set forth here by way of illustration but not of limitation. It is obvious that many other embodiments, which will be readily apparent to those skilled in the art, may be made without departing materially from the spirit and scope of the invention as defined in the appended claims. Furthermore, although elements of the invention may be described or claimed in the singular, the plural is contemplated unless limitation to the singular is explicitly stated.

What is claimed is:

1. An analog to digital converter (ADC) for converting an analog signal to a digital signal, comprising:
    an input channel for receiving said analog signal;
    a sampling circuit coupled to said input channel for sampling said analog signal and for providing a sampled analog signal, wherein said sampling circuit comprises an energy storage unit coupled to said input channel for storing charges from said input channel and comprises a switch array coupled to said energy storage unit for controlling said energy storage unit;
    an integrator coupled to said sampling circuit for receiving said sampled analog signal and a feedback signal and for integrating a superposition of said sampled analog signal and said feedback signal; and
    a feedback circuit coupled to said integrator for generating said digital signal according to an output of said integrator and for sending said feedback signal indicative of said digital signal to said integrator.

2. The ADC of claim 1, wherein said input channel is coupled to a switch.

3. The ADC of claim 1, wherein said integrator comprises an integrating capacitor coupled to a switch in series for storing said charges from said energy storage unit when said switch is turned on.

4. The ADC of claim 1, wherein said integrator comprises an error amplifier coupled to said sampling circuit for comparing a reference signal with said superposition of said feedback signal and said sampled analog signal and for generating an error signal.

5. The ADC of claim 1, wherein said feedback circuit comprises a comparator coupled to said integrator for comparing said output of said integrator with a reference signal and for generating a comparator output signal according to said comparison result.

6. The ADC of claim 5, wherein said feedback circuit comprises a multiplexer coupled to said comparator for providing said digital signal according to said comparator output signal.

7. The ADC of claim 1, wherein said feedback circuit comprises a secondary digital to analog converter (DAC) coupled to said integrator for generating said feedback signal.

8. The ADC of claim 1, further comprising:
    a filter coupled to said feedback circuit for decimating said digital signal.

9. A method comprising:
    sampling an analog signal by a sampling circuit to provide a sampled analog signal;
    integrating a superposition of said sampled analog signal and a feedback signal;
    comparing a reference signal with said superposition of said feedback signal and said sampled analog signal;
    generating an error signal according to a difference between said reference signal and said superposition;
    generating a first digital signal according to an integration result of said superposition;
    generating said feedback signal indicative of said first digital signal; and
    generating a multi-bit digital signal according to said first digital signal.

10. The method of claim 9, further comprising:
    receiving said analog signal by an input channel.

11. The method of claim 9, wherein integrating said superposition comprises:
    transferring charges from said sampling circuit to an integrating capacitor.

12. The method of claim 11, wherein generating said first digital signal comprises:
    generating an integrator output according to previous charges stored in said integrating capacitor and according to said integration result of said superposition;
    comparing said integrator output with a reference signal; and
    generating said first digital signal according to said comparison result.

13. An analog to digital converter (ADC) for converting a plurality of analog signals to a plurality of digital output signals, comprising:
    a plurality of input channels for receiving said analog signals;
    a sampling circuit coupled to said plurality of input channels for sampling a corresponding analog signal from a selected input channel of said input channels and for providing a sampled analog signal;
    an integrator coupled to said sampling circuit for receiving said sampled analog signal and a feedback signal and for integrating a superposition of said sampled analog signal and said feedback signal, wherein said integrator comprises a plurality of capacitors coupled in parallel, and wherein one of said capacitors is selected to store and accumulate charges contained in said sampled analog signal;
    a feedback circuit coupled to said integrator for generating a digital signal according to an output of said integrator and for sending said feedback signal indicative of said digital signal to said integrator; and a plurality of output channels coupled to said feedback circuit for generating said digital output signals.

14. The ADC of claim 13, wherein said plurality of input channels are coupled to a plurality of switches.

15. The ADC of claim 13, wherein said sampling circuit comprises an energy storage unit coupled to said plurality of input channels for storing charges from said selected input channel, and wherein said sampling circuit comprises a switch array coupled to said energy storage unit for controlling said energy storage unit.

16. The ADC of claim 13, wherein said plurality of capacitors are coupled to a plurality of switches respectively, and wherein said one of said plurality of capacitors is selected to stores and accumulate said charges contained in said sampled analog signal when an associate switch is turned on.

17. The ADC of claim 13, wherein said feedback circuit comprises a comparator coupled to said integrator for comparing said output of said integrator with a reference signal and for generating a comparator output signal according to said comparison result.

18. The ADC of claim 17, wherein said feedback circuit comprises a multiplexer coupled to said comparator for providing said digital signal according to said comparator output signal.

19. The ADC of claim 13, wherein said feedback circuit comprises a secondary digital to analog converter (DAC) coupled to said integrator for generating said feedback signal.

* * * * *